(12) United States Patent
Sreenivasan et al.

(10) Patent No.: US 7,802,978 B2
(45) Date of Patent: Sep. 28, 2010

(54) IMPRINTING OF PARTIAL FIELDS AT THE EDGE OF THE WAFER

(75) Inventors: Sidlgata V. Sreenivasan, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 278 days.

(21) Appl. No.: 11/694,500

(22) Filed: Mar. 30, 2007

(65) Prior Publication Data

US 2007/0228609 A1    Oct. 4, 2007

Related U.S. Application Data

(60) Provisional application No. 60/788,781, filed on Apr. 3, 2006.

(51) Int. Cl.
 *B28B 17/00* (2006.01)
 *B29C 59/00* (2006.01)
(52) U.S. Cl. .............. 425/149; 425/385; 425/387.1
(58) Field of Classification Search ............ 425/385, 425/387.1, 149
 See application file for complete search history.

(56) References Cited

U.S. PATENT DOCUMENTS

| | | | |
|---|---|---|---|
| 3,503,538 A | 3/1970 | Barnes | |
| 4,022,855 A | 5/1977 | Hamblen | |
| 4,070,116 A | 1/1978 | Frosch et al. | |
| 4,208,240 A | 6/1980 | Latos | |
| 4,364,971 A | 12/1982 | Sack et al. | |
| 4,440,804 A | 4/1984 | Milgram | |
| 4,512,848 A | 4/1985 | Deckman et al. | |
| 4,521,445 A | 6/1985 | Nablo et al. | |
| 4,552,832 A | 11/1985 | Blume et al. | |
| 4,576,900 A | 3/1986 | Chiang | |
| 4,637,904 A | 1/1987 | Rounds | |
| 4,676,868 A | 6/1987 | Riley et al. | |
| 4,707,218 A | 11/1987 | Giammarco et al. | |
| 4,731,155 A | 3/1988 | Napoli et al. | |
| 4,737,425 A | 4/1988 | Lin et al. | |
| 4,794,021 A * | 12/1988 | Potter | 427/240 |
| 4,848,911 A | 7/1989 | Uchida et al. | |
| 4,857,477 A | 8/1989 | Kanamori | |
| 4,862,019 A | 8/1989 | Ashmore, Jr. | |
| 4,866,307 A | 9/1989 | Ashmore, Jr. | |

(Continued)

FOREIGN PATENT DOCUMENTS

EP    0398589    4/1998

(Continued)

OTHER PUBLICATIONS

Zeze et al., Reactive Ion Etching of Quartz and Pyrex for Microelectonic Applications, J.Appl. Phys. 92, 3624 (2002) Oct. 1, 2002.

(Continued)

*Primary Examiner*—Maria Veronica D Ewald
(74) *Attorney, Agent, or Firm*—Laura C. Robinson (57) ABSTRACT

The present invention is directed towards several aspects of imprint lithography that have to be improved to address imprinting of partial fields and dies at the edge of the wafer.

4 Claims, 6 Drawing Sheets

U.S. PATENT DOCUMENTS

| | | |
|---|---|---|
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,932,358 A | 6/1990 | Studley et al. |
| 4,936,465 A | 6/1990 | Zold |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,110,665 A * | 5/1992 | Titterington .............. 428/32.13 |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,277,749 A | 1/1994 | Griffith et al. |
| 5,288,436 A | 2/1994 | Liu et al. |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,357,122 A | 10/1994 | Okubora et al. |
| 5,362,606 A | 11/1994 | Hartney et al. |
| 5,362,940 A | 11/1994 | MacDonald et al. |
| 5,364,222 A | 11/1994 | Akimoto et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,445,195 A | 8/1995 | Kim |
| 5,449,117 A | 9/1995 | Muderlak et al. |
| 5,451,435 A | 9/1995 | Yu |
| 5,453,157 A | 9/1995 | Jeng |
| 5,458,520 A | 10/1995 | DeMercuio et al. |
| 5,468,542 A | 11/1995 | Crouch |
| 5,480,047 A | 1/1996 | Tanigawa et al. |
| 5,512,131 A | 4/1996 | Kumar et al. |
| 5,542,605 A | 8/1996 | Campau |
| 5,545,367 A | 8/1996 | Bae et al. |
| 5,601,641 A | 2/1997 | Stephens |
| 5,612,068 A | 3/1997 | Kempf et al. |
| 5,622,747 A * | 4/1997 | Todd et al. .................. 438/759 |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,736,424 A | 4/1998 | Prybyla et al. |
| 5,753,014 A | 5/1998 | Van Rijn |
| 5,772,905 A | 6/1998 | Chou |
| 5,776,748 A | 7/1998 | Singhvi et al. |
| 5,804,474 A | 9/1998 | Sakaki et al. |
| 5,812,629 A | 9/1998 | Clauser |
| 5,817,579 A | 10/1998 | Ko et al. |
| 5,820,769 A | 10/1998 | Chou |
| 5,843,363 A | 12/1998 | Mitwalsky et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,046,056 A | 4/2000 | Parce et al. |
| 6,048,799 A | 4/2000 | Prybyla |
| 6,067,144 A | 5/2000 | Murouchi |
| 6,074,827 A | 6/2000 | Nelson et al. |
| 6,103,445 A * | 8/2000 | Willson et al. ............ 430/270.1 |
| 6,150,680 A | 11/2000 | Eastman et al. |
| 6,180,239 B1 | 1/2001 | Whitesides et al. |
| 6,218,316 B1 | 4/2001 | Marsh |
| 6,242,363 B1 | 6/2001 | Zhang |
| 6,245,213 B1 | 6/2001 | Olsson et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,928 B1 | 5/2002 | Eissa |
| 6,387,330 B1 | 5/2002 | Bova et al. |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,423,207 B1 | 7/2002 | Heidari et al. |
| 6,482,742 B1 | 11/2002 | Chou |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Young et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,534,418 B1 | 3/2003 | Plat et al. |
| 6,541,360 B1 | 4/2003 | Plat et al. |
| 6,545,744 B2 | 4/2003 | Zemel |
| 6,565,928 B2 | 5/2003 | Sakamoto et al. |
| 6,580,172 B2 | 6/2003 | Mancini et al. |
| 6,586,268 B1 | 7/2003 | Kopola et al. |
| 6,593,240 B1 | 7/2003 | Page |
| 6,621,960 B2 | 9/2003 | Wang et al. |
| 6,623,579 B1 | 9/2003 | Smith et al. |
| 6,627,544 B2 | 9/2003 | Izumi et al. |
| 6,629,292 B1 | 9/2003 | Corson et al. |
| 6,632,742 B2 | 10/2003 | Yang et al. |
| 6,635,581 B2 | 10/2003 | Wong |
| 6,646,662 B1 | 11/2003 | Nebashi et al. |
| 6,665,014 B1 | 12/2003 | Assadi et al. |
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,776,094 B1 | 8/2004 | Whitesides et al. |
| 6,786,996 B2 | 9/2004 | Emami |

| | | |
|---|---|---|
| 6,809,356 B2 | 10/2004 | Chou |
| 6,828,244 B2 | 12/2004 | Chou |
| 6,833,325 B2 | 12/2004 | Huang et al. |
| 6,849,558 B2 | 2/2005 | Schaper |
| 6,870,301 B2 | 3/2005 | Choi et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,946,360 B2 | 9/2005 | Chou |
| 6,951,173 B1 | 10/2005 | Meissl et al. |
| 6,955,767 B2 | 10/2005 | Chen |
| 6,964,793 B2 | 11/2005 | Willson et al. |
| 7,027,156 B2 | 4/2006 | Watts et al. |
| 7,029,944 B1 | 4/2006 | Conley, Jr. et al. |
| 7,071,088 B2 | 7/2006 | Watts et al. |
| 7,077,992 B2 | 7/2006 | Sreenivasan et al. |
| 7,105,452 B2 | 9/2006 | Sreenivasan |
| 7,117,583 B2 | 10/2006 | Dinan et al. |
| 7,128,875 B2 | 10/2006 | Cubicciotti |
| 7,214,624 B2 | 5/2007 | Fujita et al. |
| 7,244,386 B2 | 7/2007 | Sreenivasan et al. |
| 7,281,921 B2 | 10/2007 | Watts et al. |
| 7,282,550 B2 | 10/2007 | Xu et al. |
| 7,323,130 B2 | 1/2008 | Nimmakayala et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2002/0191141 A1 | 12/2002 | Liao |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0149367 A1 | 8/2004 | Olsson et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0250945 A1 | 12/2004 | Zheng et al. |
| 2005/0006343 A1* | 1/2005 | Choi et al. .................... 216/59 |
| 2005/0037143 A1 | 2/2005 | Chou et al. |
| 2005/0056963 A1 | 3/2005 | McCutcheon |
| 2005/0250052 A1* | 11/2005 | Nguyen ..................... 430/322 |
| 2005/0274219 A1 | 12/2005 | Choi et al. |
| 2005/0275251 A1 | 12/2005 | Choi et al. |
| 2005/0275311 A1 | 12/2005 | Choi et al. |
| 2005/0276919 A1 | 12/2005 | Truskett et al. |
| 2005/0284886 A1 | 12/2005 | Penciu |
| 2006/0005657 A1 | 1/2006 | Choi et al. |
| 2006/0017876 A1 | 1/2006 | Watts |
| 2006/0049455 A1 | 3/2006 | Jang et al. |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0114558 A1 | 6/2006 | Shimizu |
| 2007/0126150 A1 | 6/2007 | GanapathiSubramanian et al. |
| 2007/0132152 A1 | 6/2007 | Choi et al. |
| 2007/0170617 A1 | 7/2007 | Choi et al. |
| 2007/0228610 A1 | 10/2007 | Sreenivasan et al. |
| 2007/0231981 A1 | 10/2007 | Sreenivasan et al. |
| 2007/0243655 A1 | 10/2007 | Schmid et al. |

FOREIGN PATENT DOCUMENTS

| | | |
|---|---|---|
| FR | 2677043 A1 | 12/1992 |
| JP | 3-32888 | 2/1981 |
| JP | 58-129074 | 8/1983 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 00/54107 | 9/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |

OTHER PUBLICATIONS

Leech et al., Reactive Ion Etching of Quartz and Glasses for Microfabrication, SPIE 3680, 839 (1999) Mar. 1, 1999.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Otto et al., Reproducibility and Homogeneity in Step and Repeat UV-Nanoimprint Lithography, Microelectronic Engineering 73-74, pp. 152-156 Jan. 1, 2004.

Kawata et al., Imprint/Photo Hybrid Litography Using Conventional Contact Aligner, Japanese Journal of Applied Physics, vol. 43, No. 6B, pp. 4027-4030 Jun. 29, 2004.

Kim et al., Reducing Photocurable Polymer Pattern Shrinkage and Roughness during Dry Etching in Photo-Nanoimprint Lithography, Japanese Journal of Applied Physics, vol. 43, No. 6B, pp. 4022-4026 Jun. 29, 2004.

Abstract of Japanese Patent 58-129074, Aug. 1, 1983.

Chou et al., Ultrafast and Direct Imprint of Nanostructures in Silicon, Nature, col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Wilson et al., Lithography and Etch Issues, Handbook of Multilevel Metallization for Integrated Circuits, pp. 566-567 Jan. 1, 1993.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Park et al., Aligning Liquid Crystals Using Replicated Nanopatterns, PSI Scientific Report 2002, vol. VII, p. 85 Mar. 1, 2003.

McMackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and-Flash Imprint Lithography, J. Vac. Sci. Technol. B 22(6) Nov. 1, 2004.

Abstract of Japanese Patent 3-32888, Feb. 13, 1991.

Abstract of French Patent 2677043, Dec. 1, 1992.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/692,450, naming Inventors Sreenivasan et al., entitled Patterning a Plurality of Fields on a Substrate to Compensate for Differing Evaporation Times, filed Mar. 28, 2007.

U.S. Appl. No. 11/695,850, naming Inventors Sreenivasan et al., entitled Method of concurrently patterning a substrate having a plurality of fields and a plurality of alignment marks, filed Apr. 3, 2007.

U.S. Appl. No. 11/693,236, naming Inventors Schmid et al., entitled Self-Aligned Process for Fabricating Imprint Templates Containing Variously Etched Features, filed Mar. 29, 2007.

Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.

Modreanu et al., Optical Properties of LPCVD Silicon Oxynitride, Thin Solid Films 337, pp. 82-84.

Casey et al., Control of Metal Deposition in a Web Coater, Controlling in both Transverse and Machine Direction, Proceedings, Annual Technical Conference—Society of Vacuum Coaters May 4, 1990.

Lu et al., The Effect of Deposition Parameters on Performance of VME-FPC, Proceedings of the IEEE International Vacuum Microelectronics Conference, IVMC Aug. 16, 2001.

Abstract of Japanese patent 02-192045, Jul. 27, 1990.

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Chou, Nanoimprint Lithography and Lithographically Induced Self-Assembly, MRS Bulletin, pp. 512-517 Jul. 1, 2001.

Braeuer et al., Precise Polymer Micro-Optical Systems, MRS Bulletin, pp. 519-522 Jul. 1, 2001.

Choi et al., Design of Orientation Stages for Step and Flash Imprint Lithography, Precision Engineering, pp. 192-199 Jan. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Xia et al., Soft Lithography, Annu Rev. Mater Sci. 1998 28: 153-184 Jan. 1, 1998.

Chou et al., Imprint of Sub-25 nm Vias and Trenches in Polymers, Appl. Phys. Lett. 67 (21) Nov. 20, 1995.

Otto et al., Characterization and Application of a UV-based Imprint Technique, Microelectronic Engineering 57-58, pp. 361-366 Jan. 1, 2001.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

* cited by examiner

IMPRINTING OF PARTIAL FIELDS AT THE EDGE OF THE WAFER

This application claims benefit to U.S. Provisional Application Ser. No. 60/788,781, which is hereby incorporated by reference herein.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

An imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

Figure 1:
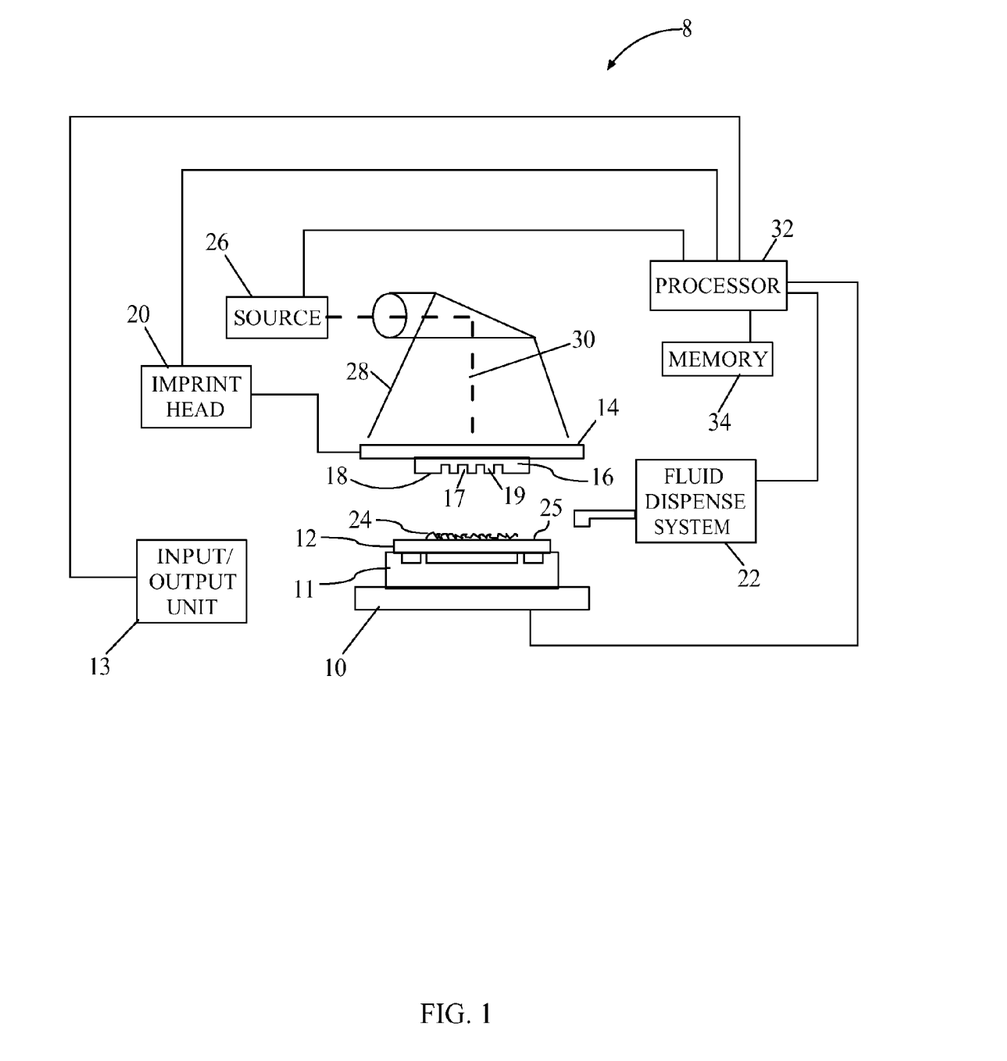
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband energy that causes polymeric material 24 to solidify and/or cross-link conforming to the shape of a surface 25 of substrate 12 and patterning surface 18, defining a patterned layer 50 on substrate 12.

The broadband energy may comprises an actinic component including, but not limited to, ultraviolet wavelengths, thermal energy, electromagnetic energy, visible light and the like. The actinic component employed typically depends on the material from which imprinting layer 12 is formed. Control of this process is regulated by a processor 32 that is in data communication with stage 10, imprint head 20, fluid dispense system 22, source 26, operating on a computer readable program stored in memory 34.

The above-mentioned may be further employed in imprint lithography processes and systems referred to in U.S. Pat. No. 6,932,934 entitled "Formation of Discontinuous Films During an Imprint Lithography Process" and United States patent application publication 2004/0124566, filed as U.S. patent application Ser. No. 10/194,991 entitled "Step and Repeat Imprint Lithography Processes," both of which are incorporated by reference herein.

The present invention involves problems associated with imprinting the edge fields and dies. Since partial fields that contain full die lead to yielding devices, it is important that the performance of the yielding die be as good as inner die in a wafer. Therefore, even if only one edge or a corner of the field is on the wafer, there should be as many alignment marks as possible in these locations to maximize alignment performance. It is good to have alignment of X, Y and theta and ensure that mag_x, mag_y and ortho errors are not changing from the previous inner field to the edge field; then the overlay performance will work well. The 8 channel i-MAT and i-MAT design, noted herein, that allows for very high flexibility in alignment mark location may be used on the tool to allow this. An example of a magnification correction is described in U.S. patent application Ser. No. 11/142,839 entitled "Apparatus to Vary Dimensions of a Substrate during Nano-Scale Manufacturing" and U.S. patent application Ser. No. 11/142,834 entitled "Method of Varying Dimensions of a Substrate during Nano-Scale Manufacturing," both of which are incorporated by reference herein.

Figure 2A:
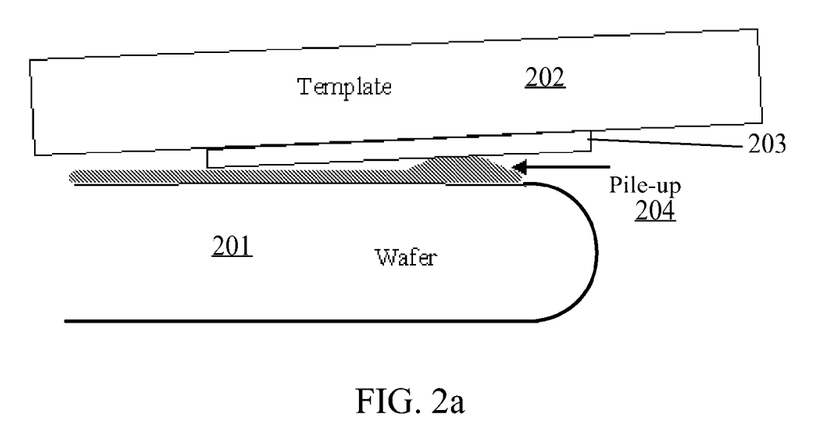
FIG. 2 is a schematic of a litho field that has multiple dies in it, six in present illustration.
Figure 2B:
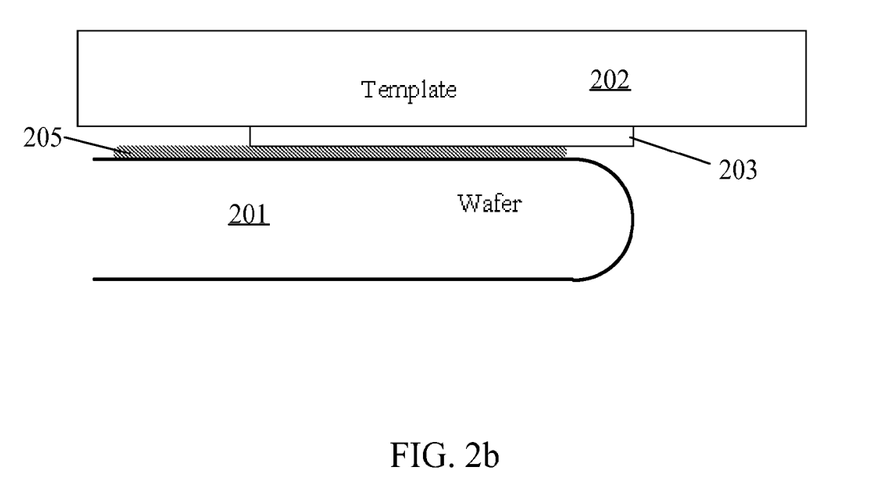

The transfer layer (such as BARC) that is used as an adhesion promoter is spin coated onto the wafers prior to imprinting. During the spin coating process, spin-coating material wets the edge of the wafer, which leads to wafer edge contamination. Therefore, a thin boundary of the transfer layer needs to be removed, typically using a type of solvent (wet edge bead removal process, such as disclosed in U.S. Pat. No. 6,494,221 which is hereby incorporated by reference herein. This can lead to a material pile up at the edge due to the edge bead removal process. If this pile up is higher than 100 or 200 nm, or for some imprint processes even as high as 50 nm, it can cause difficulty in edge field printing. FIG. 2A illustrates an example of such a pile up of spin-on material on a wafer 201. As can be seen, the template 202 with the active imprinting area 203 is caused to be tilted up due to the pile up 204 at the edge of the wafer 201. Therefore, the transfer layer material should be designed such that its edge bead is removable without any pile up. Therefore, an optically imagable material that can be developed to eliminate the edge bead 204 is desirable. FIG. 2B illustrates the imprinting of a template 202 upon the material 205 in a proper configuration in the absence of a pile up of material, such as shown in FIG. 2A. The material can be a positive tone resist (the regions exposed to photons go away in the develop step) or it can be negative tone wherein the entire wafer except for the edge bead is exposed to the photons. An example of a positive tone photoresist that will be applicable for this situation is i-line resist available under the name ULTRA-i™ 123 available from Rohm and Haas's located in Philadelphia, Pa.

Figure 3:
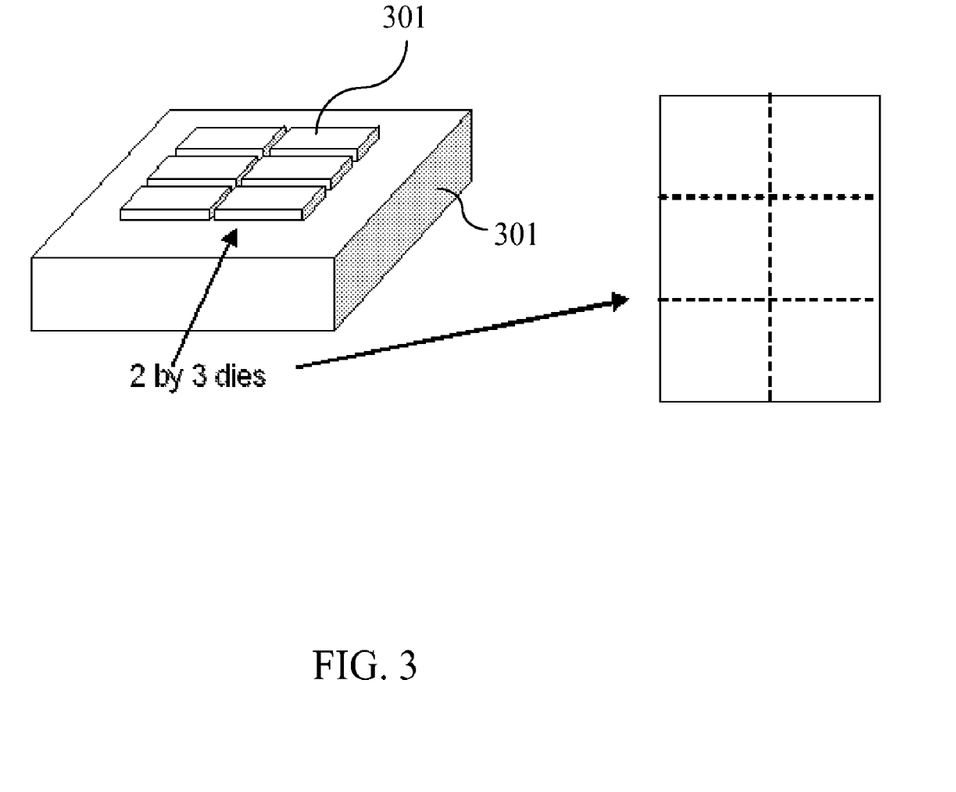
FIG. 3 is a perspective view of a template having each die located on a separate mesa to confine imprint liquid to a specific die during edge field printing.

Referring to FIG. 3, the template 300 may be designed in such a way that it has each die 301 located on its own mesa to confine the imprint liquid to specific die during edge field printing. When printing an edge field that has at least one full die, the template mesas that include the full die can receive the imprint liquid, while the partial die may receive a non-reactive liquid such as isoproponol to avoid the template from making direct contact with the substrate. An example of a template is described in U.S. Pat. No. 6,696,220 entitled "Template for Room Temperature, Low Pressure Micro- and Nano-Imprint Lithography," which is incorporated by reference herein.

Figure 4:
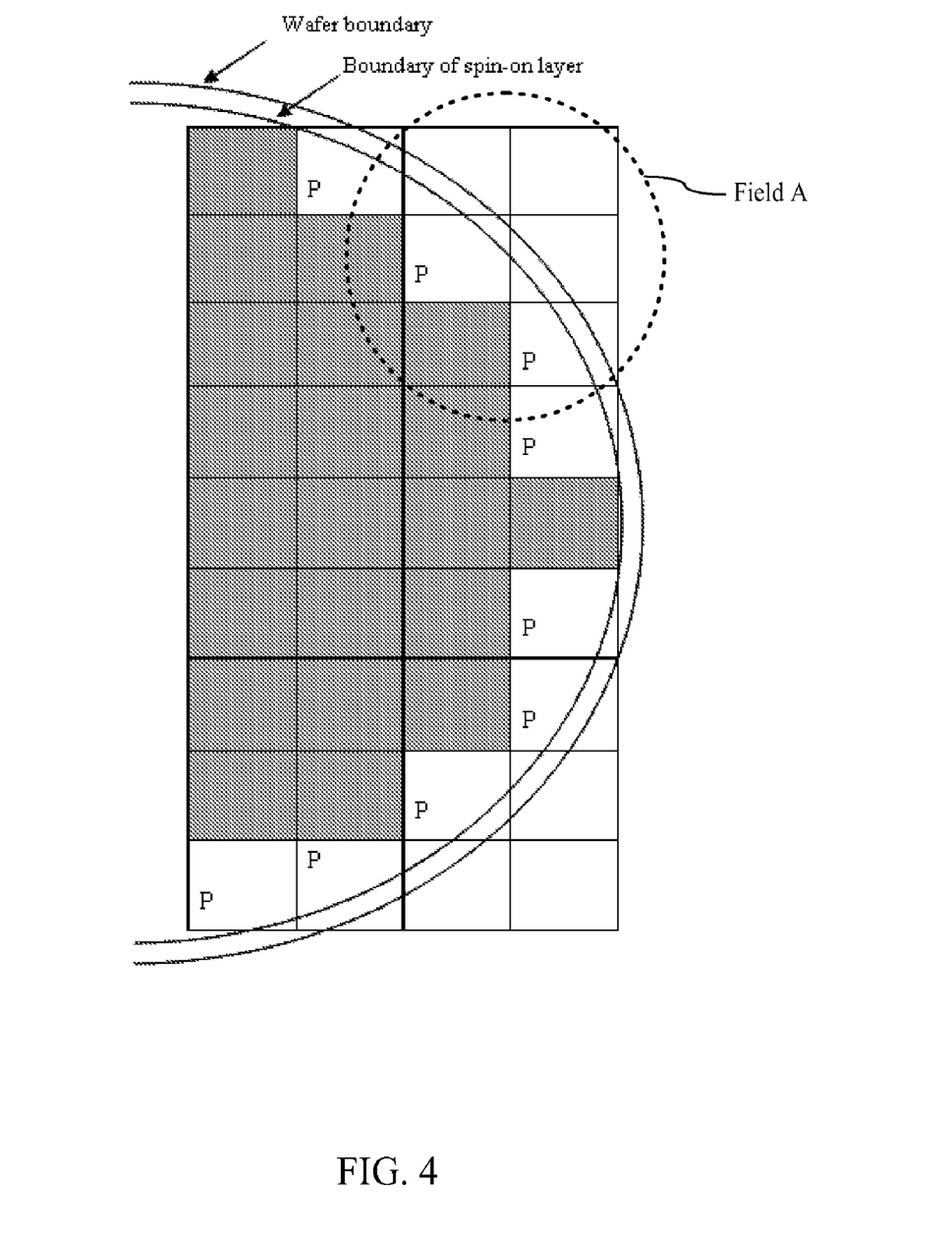
FIG. 4 is a schematic of litho fields at the edge of a substrate having full dies (shaded) filled with imprinting fluid.

Referring to FIG. 4, there is illustrated an example of imprinting where only full dies (the shaded ones) are filled with imprinting fluid. In this case, all imprint fields are potentially yieldable and a stepped imprint boundary is formed. As compared to this case, it is necessary to cover the entire surface of the wafer even if some dies are not yieldable. In this case, all partial dies, noted with "P" in FIG. 4 will be imprinted while their fluid areas are defined by the combination of the die mesa and underlying layer boundary, which results in a circular imprinted boundary.

Figure 5:
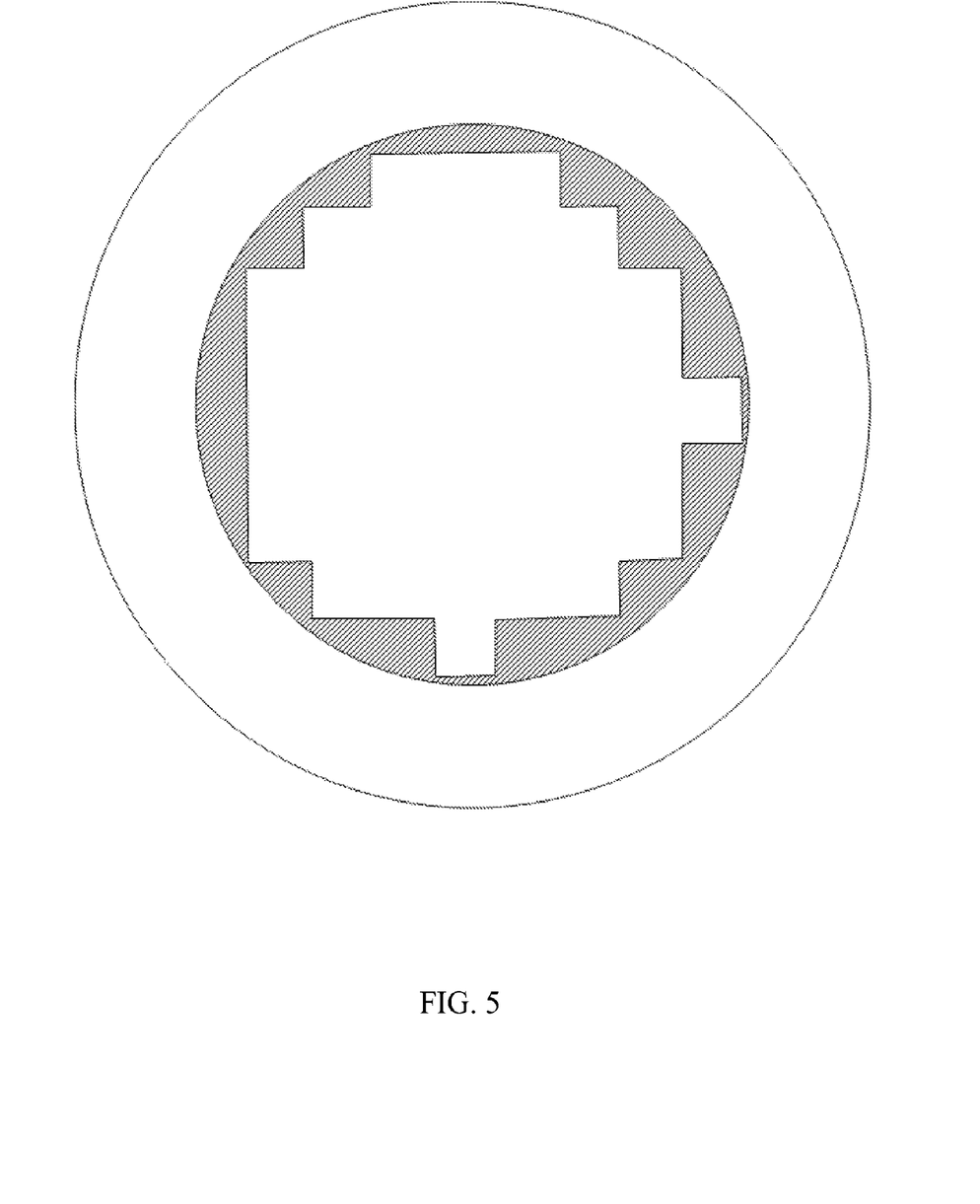
FIG. 5 is a schematic of a template for imprinting of partial litho fields on a substrate.

Referring to FIG. 5, optionally, all the partial dies can be imprinted simultaneously with a large area template. Since these dies do not read to yielding devices, a large template that is "die layout specific" and that is specifically designed to have mesas only in the partial die regions can be used. Such a template would have regions outside and inside the partial die regions as etched back and no imprint liquid would be placed in the etched back regions. Since these dies do not yield, their overlay performance is not optical. Further, they do not have to have expensive, high resolution features in the large area templates. For example, the patterns can be chosen such that it has comparable pattern density variation to the high-resolution version, but only has features >400 nm to allow laser patterning. The similar pattern density should assist in avoiding undesirable etch and CMP loading effects. An example of a large area process is described in United States patent application publication 2005/0189676, filed as U.S. patent application Ser. No. 10/788,700, entitled "Full-Wafer or Large Area Imprinting with Multiple Separated Sub-Fields for High Throughput Lithography" which is incorporated by reference herein.

Alternatively, the fluid dispense has to be very accurate to allow liquid to be placed only over the region the full die and the partial die exist on the wafer (excluding the annular exclusion zone of the wafer). Care should be taken to tailor the drop dispense at the wafer edge to substantially avoid liquid from wetting the template that is hanging out beyond the edge of the wafer. For example, it has been found that long lines and gratings tend to draw liquid along them beyond the boundary of the wafer. This phenomenon does not occur as readily if the features at the edge of the wafer are holes on the templates. Therefore, lower amounts of liquid should be placed in pattern areas that tend to draw liquid beyond the edge of the wafer such as gratings.

Figure 6:
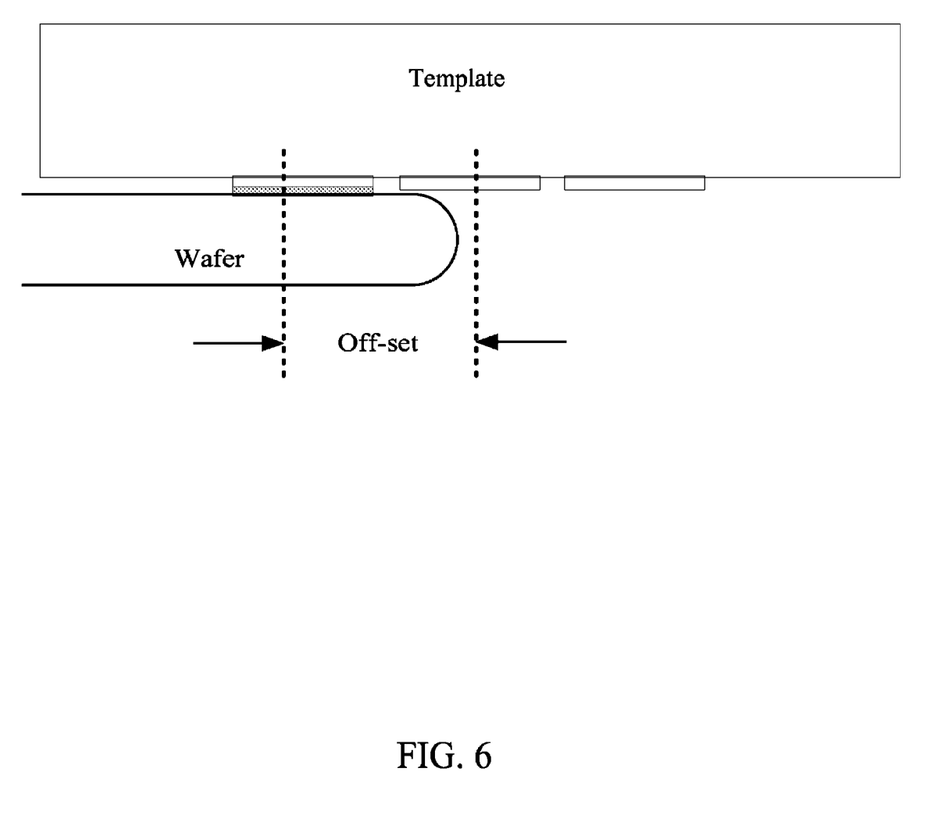
FIG. 6 is a simplified side view of a portion of a template positioned in superimposition with a substrate such that during imprinting of a single die on the substrate, a pressure center is off-set from the template center.

When printing edge fields, the center of pressure of the imprint fluid active on the template is not at the center of the template. FIG. 6 illustrates the case of only a single die imprinted where the pressure center is significantly off-set from the template center. Thus, for the case of Field A of FIG. 4, a significant off-set exists between the center of pressure of the imprinting and the center of the template. Therefore, a passive flexure may lead to tilted imprints where the residual layer thickness varies approximately linearly across the field. Therefore, the imprinting method can use an active flexure wherein the two tilt axes are controlled by voice coils. Alternatively the method can use a three-legged voice coil imprint head as described in United States patent application publication 2006/0005657, filed as U.S. patent application Ser. No. 11/142,825 entitled, "Method and System to Control Movement of a Body for Nano-Scale Manufacturing" and U.S. patent application Ser. No. 11/142,838 entitled "Compliant Device for Nano-Scale Manufacturing" both of which are incorporated herein by reference. In each case, the forces on the voice coils are set asymmetrically to achieve a center of pressure that is different from the center. This allows imprinting of edge fields while obtaining uniform residual layer. The residual layer control can be further improved by using film thickness measurement and feeding it back to adjust the dispense volume.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

The invention claimed is:

1. An imprint lithography system comprising a wafer;
an adhesion promoter deposited on the wafer without a raised bead at its edge near an edge of the wafer; and
an imprint lithography template spaced apart from the wafer to be lowered towards the wafer in order to imprint a pattern in an imprint material deposited on the adhesion promoter; and,
a force control system configured to provide asymmetrical forces altering a center of pressure of the imprint lithography template to the center of pressure of the imprint material deposited on the adhesion promoter.

2. The system as recited in claim 1, wherein the adhesion promoter comprises an optically imagable material.

3. The system as recited in claim 2, wherein the adhesion promoter comprises a positive tone resist.

4. The system as recited in claim 2, wherein the adhesion promoter comprises a negative tone resist.

* * * * *